US010833630B2

(12) United States Patent
Wu et al.

(10) Patent No.: US 10,833,630 B2
(45) Date of Patent: *Nov. 10, 2020

(54) APPARATUSES AND METHODS FOR TEMPERATURE INDEPENDENT OSCILLATORS

(71) Applicant: MICRON TECHNOLOGY, INC., Boise, ID (US)

(72) Inventors: Jun Wu, Jiangsu (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

This patent is subject to a terminal disclaimer.

(21) Appl. No.: 16/225,678

(22) Filed: Dec. 19, 2018

(65) Prior Publication Data

US 2019/0123685 A1    Apr. 25, 2019

Related U.S. Application Data

(63) Continuation of application No. 14/785,823, filed as application No. PCT/CN2015/088876 on Sep. 2, 2015, now Pat. No. 10,171,032.

(51) Int. Cl.
*H03B 5/04* (2006.01)
*G11C 7/10* (2006.01)
(Continued)

(52) U.S. Cl.
CPC .............. *H03B 5/04* (2013.01); *G11C 7/1075* (2013.01); *G11C 11/40611* (2013.01);
(Continued)

(58) Field of Classification Search
CPC ......... G11C 11/40611; G11C 11/40615; G11C 7/1075; H03K 3/03; H03K 3/011;
(Continued)

(56) References Cited

U.S. PATENT DOCUMENTS 7,109,804 B2    9/2006  Mader et al.
7,486,151 B2    2/2009  Goudo
(Continued)

FOREIGN PATENT DOCUMENTS

CN    1726641 A    1/2006
CN    102710238 A    10/2012
(Continued)

OTHER PUBLICATIONS

First Office Action dated Jan. 29, 2019 for KR Application No. 10-2018-7003252; pp. all.

(Continued)

*Primary Examiner* — Arnold M Kinkead
(74) *Attorney, Agent, or Firm* — Dorsey & Whitney LLP

(57) ABSTRACT

Apparatuses and methods for temperature independent oscillator circuits are disclosed herein. An example apparatus may include a pulse generator circuit configured to provide a periodic pulse based on the charging and discharging and discharging of a capacitor and further based on a reference voltage. The pulse generator circuit may include a capacitor coupled between a first reference voltage and a first node, wherein the capacitor is configured to be charged and discharged through the node in response to the periodic pulse, a resistor and a diode coupled in series between a second node and a second reference voltage, and a comparator coupled to the first and second nodes and configured to provide the periodic pulse based on voltages on the first and second nodes, wherein a period of the periodic pulse is based at least on the resistor and the a current.

17 Claims, 5 Drawing Sheets

(51) Int. Cl.
G11C 11/406 (2006.01)
H03K 3/03 (2006.01)
H03K 4/502 (2006.01)
H03K 3/0231 (2006.01)
H03K 3/011 (2006.01)
H03B 5/24 (2006.01)
H03L 1/02 (2006.01)

(52) U.S. Cl.
CPC .......... *G11C 11/40615* (2013.01); *H03B 5/24* (2013.01); *H03K 3/011* (2013.01); *H03K 3/0231* (2013.01); *H03K 3/03* (2013.01); *H03K 4/502* (2013.01); *H03L 1/026* (2013.01)

(58) Field of Classification Search
CPC . H03K 4/502; H03B 5/24; H03B 5/04; H03L 1/026
USPC .................. 331/111, 143, 175; 327/175, 182
See application file for complete search history.

(56) References Cited

U.S. PATENT DOCUMENTS

| 10,171,032 B2 * | 1/2019 | Wu | G11C 7/1075 |
| 2002/0097624 A1 | 7/2002 | Andersen et al. | |
| 2003/0128076 A1 | 7/2003 | Ogawa et al. | |
| 2006/0126238 A1 | 6/2006 | Goudo | |
| 2012/0075888 A1 | 3/2012 | Eom et al. | |
| 2014/0176249 A1 | 6/2014 | Wu et al. | |
| 2018/0167030 A1 | 6/2018 | Wu et al. | |

FOREIGN PATENT DOCUMENTS

| CN | 103475189 | 12/2013 |
| CN | 104054262 | 9/2014 |
| CN | 204258726 | 4/2015 |
| JP | 969765 A | 3/1997 |
| KR | 20050085690 A | 8/2005 |
| KR | 20140139857 A | 12/2014 |
| WO | 2006046572 A1 | 5/2006 |
| WO | 2014/176249 A1 | 6/2014 |
| WO | 2017035816 A1 | 3/2017 |

OTHER PUBLICATIONS

Final Rejection for KR patent application No. 10-2018-7003252 dated May 13, 2019; pp. all.
International Search Report and Written Opinion received for PCT/CN2015/088876 dated Apr. 28, 2016; pp. all.
CN Office Action dated Aug. 3, 2020 for CN Application No. 201580081953.8, pp. all.

\* cited by examiner

APPARATUSES AND METHODS FOR TEMPERATURE INDEPENDENT OSCILLATORS

CROSS REFERENCE TO RELATED APPLICATION(S)

This application is a continuation of pending U.S. patent application Ser. No. 14/785,823 filed Oct. 20, 2015 and issued as U.S. Pat. No. 10,171,032 on Jan. 1, 2019, which is a 371 National Stage filing of International Application No. PCT/CN2015/088876 filed Sep. 2, 2015. The aforementioned applications, and issued patent, are incorporated herein by reference, in their entirety, for any purpose.

BACKGROUND

Oscillators may be included in integrated circuits to control the timing of various operations and circuits by providing an oscillating signal of a select period. For example, oscillators may be included in a memory to control the timing of various operations, such as write operations, read operations, refresh operations, and etc. Some oscillators may operate based on resistance and capacitance characteristics of their circuits, e.g., RC oscillators. These oscillators, however, may be affected by operating temperatures in undesirable ways. For example, resistance, current, and voltage characteristics of the oscillators may change with changing temperatures. These changing characteristics may result in a change in the period of the oscillating signal, which may adversely affect operations of the host integrated circuit. The adverse effects due to the change in period may at least include increased power consumption and undesirable timing of circuit operations.

SUMMARY

Example apparatuses and methods for temperature independent oscillator circuits are disclosed herein. An example apparatus may include a pulse generator configured to provide a periodic pulse based on the charging and discharging of a capacitor and further based on first and second reference voltages. The pulse generator may include the capacitor, a resistor, a diode, and a comparator. The capacitor may be coupled between the first reference voltage and a first node, and may be configured to be charged and discharged through the first node in response to the periodic pulse. The resistor and diode may be coupled in series between a second node and the second reference voltage. The comparator may be coupled to the first and second nodes and configured to provide the periodic pulse based on voltages on the first and second nodes. A period of the periodic pulse may be based at least on the resistor and a current.

Another example apparatus may include a pulse generator configured to provide a periodic pulse signal. The pulse generator may include a current source, a capacitor a resistor, a diode, and a comparator. The current source may be configure to provide a constant current and the capacitor may be coupled between a first node and a first reference voltage and configured to charge and discharge responsive to the periodic pulse signal. The resistor and diode may be coupled in series between a second node and a second reference voltage source, and the comparator may be coupled to the first and second nodes at first and second inputs, respectively, and configured to provide the periodic pulse signal, wherein a period of the periodic pulse signal is based at least in part on the capacitor, the resistor, and the constant current. The example apparatus may further include a flip flop coupled to the pulse signal generator and configured to provide a periodic output signal based on the periodic pulse signal.

Another example apparatus may include a refresh timing circuit and an oscillator circuit. The refresh timing circuit may be configured to provide refresh commands based on a number of periods of an oscillator signal, and the oscillator circuit may be coupled to the refresh timing circuit and configured to provide the oscillator signal having a period. The oscillator circuit may include a flip flop configured to provide the oscillator signal responsive to a pulse signal, and a pulse generator circuit coupled to the flip-flop and configured to provide the pulse signal. The pulse generator circuit may at least include a capacitor and a comparator. The capacitor may be coupled between a first node and a first reference voltage and configured to charge and discharge responsive to the pulse signal. The comparator may have a first input coupled to the first node, a second input coupled to a second reference voltage, and an output coupled to the flip flop, and the output of the comparator may provide the pulse signal.

DETAILED DESCRIPTION

Figure 1:
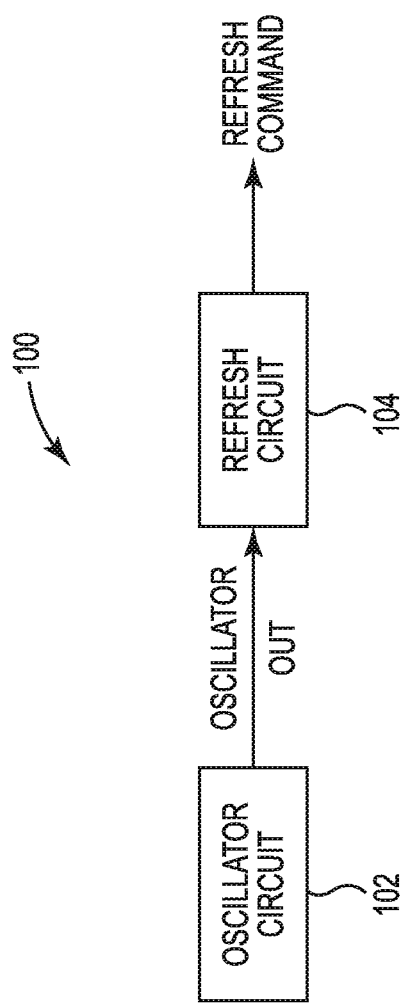
FIG. 1 is block diagram of an apparatus including a refresh timing circuit in accordance with an embodiment of the present disclosure.

Apparatuses and methods for temperature independent oscillator circuits are disclosed herein. Temperature independent oscillator circuits may be less susceptible to providing oscillating signals having a period that changes with respect to changes in temperature. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As noted, oscillator circuits may provide oscillating signals of desired periods to other circuits on an integrated circuit to control the timing of their respective operation. Timing of the operations may require a constant, unchanging period for the circuits to operate as intended. Memories, for example, may periodically perform one or more operations to ensure the validity of the data stored therein. For example, a dynamic random access memory (DRAM) may periodically perform a refresh operation to "refresh" the stored data, e.g., the stored charge representing the data, since DRAMs are volatile. Refresh operations are used to ensure the validity of the stored data.

The timing of the refresh operation may be based on an oscillator circuit providing an oscillating signal of a desired period. Based on the period of the oscillating signal or a derivative thereof, a refresh operation may be performed on one or more memory cells, for example. The refresh operation, which may have its own characteristic period, may change with temperature due to the retention characteristics of the memory cells. For example, at relatively low temperatures, memory cells may have better retention characteristics, which may allow the refresh operations to occur less often. In contrast, at relatively high temperatures, memory cells may have poorer retention characteristics, which may cause the refresh operations to occur more often. Accordingly, the timing of, the refresh operations may affect the validity of the data stored in a memory cell. Stated another way, the period between successive refresh operations may affect the validity of the data.

Also as noted, conventional oscillators may have some temperature dependence, e.g., the period of the oscillating signals provided by the oscillators may change with respect to temperature. Conventional refresh timing circuits may be able to absorb such changes to the oscillating signals over a relatively small temperature range, but may have trouble doing so in other temperature ranges. For example, a refresh timing circuit may not be able to compensate for changes to an oscillating signal at temperature extremes, −6° C. or less and 90° C. and greater because the change of the period of the oscillating signal may be too great. At the low temperature extreme, the current of the conventional oscillator circuit may undesirably increase. The increase in current may lead to an increase in power consumption and also to an increase in the timing of the refresh operation, e.g., the period between refresh operations may decrease. In contrast, at the high temperature extreme, the timing of the refresh operation may decrease. e.g., the period between refresh operations may increase, which may result in the memory cells not being refreshed as often as desired and possibly leading to a loss of data. Accordingly, it may be desirable to have an oscillator circuit that is temperature independent, e.g., having a temperature coefficient of zero.

FIG. 1 is a block diagram of an apparatus that includes a refresh timing circuit 100 in accordance with an embodiment of the present disclosure. Example apparatuses may include an electronic device, a smartphone, a computing device, a wearable electronic device, and etc. The refresh timing circuit 100 may be included in a memory, for example, and may cause one or more memory cells of the memory to be refreshed. Example memories include volatile memories, such as DRAM, or other memories that need periodic refresh operations to maintain stored data. The refresh timing circuit 100 may at least include an oscillator circuit 102 and a refresh circuit 104. The oscillator circuit 102 may provide an oscillating signal OSCILLATOR OUT to the refresh circuit 104. The refresh circuit 104, in response, may provide a REFRESH COMMAND signal.

The oscillator circuit 102 may generate the oscillating signal OSCILLATOR OUT having a period tOsc. The period tOsc may be determined by at least a capacitance and a resistance characteristic of the oscillator circuit 102. The oscillator circuit 102 may include one or more transistors, and one or more resistance, and capacitive components. One or more of the components may be selected to eliminate or reduce a temperature effect on the OSCILLATOR OUT signal. In other words, the oscillator circuit 102 may be configured to include components and have operating conditions so that the temperature coefficient of the oscillator circuit 102 may have negligible or no effect on the period of tOsc of the OSCILLATOR OUT signal. For example, the oscillator circuit 102 may include one or more resistors and provide one or more reference currents such that their respective temperature coefficients may offset each other, which may result in the oscillating signal OSCILLATOR OUT having no or reduced temperature dependence. Having a temperature coefficient of zero may allow the oscillator circuit 102 to provide the OSCILLATOR OUT signal with a period tOsc that does not change with respect to temperature (e.g., temperature independent).

The refresh circuit 104 may provide the REFRESH COMMAND based at least on the OSCILLATOR OUT signal received from the oscillator circuit 102. The REFRESH COMMAND may be periodically provided, such that the REFRESH COMMAND may have a period of tREF. The tREF period may be based on the tOsc period or may be a derivative of the tOsc period, and further based on a temperature of the host memory. Due to temperature dependency of memory cell retention characteristics, the tREF period may change with temperature in an attempt to ensure that stored data is not lost. By receiving an OSCILLATOR OUT signal with a period that is not temperature dependent, the refresh circuit 104 may be able to provide the REFRESH COMMAND signal at a desired time across a wide temperature range.

Figure 2:
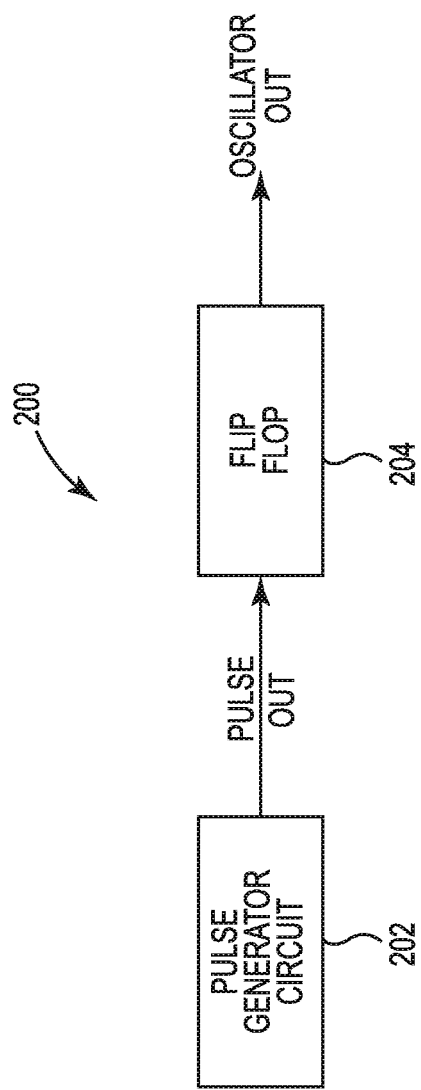
FIG. 2 is a block diagram of an oscillator circuit in accordance with an embodiment of the present disclosure.

FIG. 2 is a block diagram of an oscillator circuit 200 in accordance with an embodiment of the present disclosure. The oscillator circuit 200 may be an example of the oscillator circuit 102 of FIG. 1. The oscillator circuit 200 may include a pulse generator circuit 202, which may also be referred to herein as a pulse generator, and a flip-flop 204. The pulse generator circuit 202 may provide a PULSE OUT signal to the flip-flop 204. In response to receiving the PULSE OUT signal, the flip-flop 204 may provide the OSCILLATOR OUT signal, which may be the output of the oscillator circuit 200. A period of the OSCILLATOR OUT signal, tOsc, may be based on a period of the PULSE OUT signal.

The pulse generator circuit 202 may provide the PULSE OUT to the flip-flop 204. A period of the PULSE OUT signal, tPU, may be temperature independent based on one or more circuit components included in the pulse generator circuit 202. In some embodiments, the period tPU may be determined by an RC time constant of the pulse generator circuit 202. While the separate components that provide the RC time constant may be temperature dependent, e.g., their respective values change with respect to temperature, the combination of the components may be such that tPU may be temperature independent. For example, a resistive component may have a positive temperature coefficient, e.g., a resistance value of the component increases with increases in temperature, whereas a voltage level provided by a p-n junction, for example, may have a negative temperature coefficient, e.g., the voltage level changes inversely with temperature. In some embodiments, a junction of a bipolar junction transistor may provide the voltage level. In some embodiments, an n-MOS p-n junction may provide the voltage level. Additionally, a current level, which may also affect the temperature dependence of the period tPU, may also be used to remove the temperature dependence of the period tPU. Thus, by including components that have substantially equal but inverse temperature coefficients, the temperature coefficient of the pulse generator circuit 202 may have no or limited effect on the period tPU of the OSCILLATOR OUT signal.

The flip-flop 204 may receive the PULSE OUT signal form the pulse generator circuit 202 and provide the OSCILLATOR OUT signal in response. The PULSE OUT signal may be received at a clock input of the flip-flop 204, for example. In some embodiments, the flip-flop 204 may be a rising edge triggered flip-flop. The OSCILLATOR OUT signal may be a square wave, for example, with a period of tOsc, which may be determined by the period tPU of the PULSE OUT signal. In some embodiments, the period of the OSCILLATOR OUT signal may be equal to the period of the PULSE OUT signal. The OSCILLATOR OUT signal may be provided as a periodic reference signal, for example, to a refresh circuit, such as the refresh circuit 104 of FIG. 1.

Figure 3:
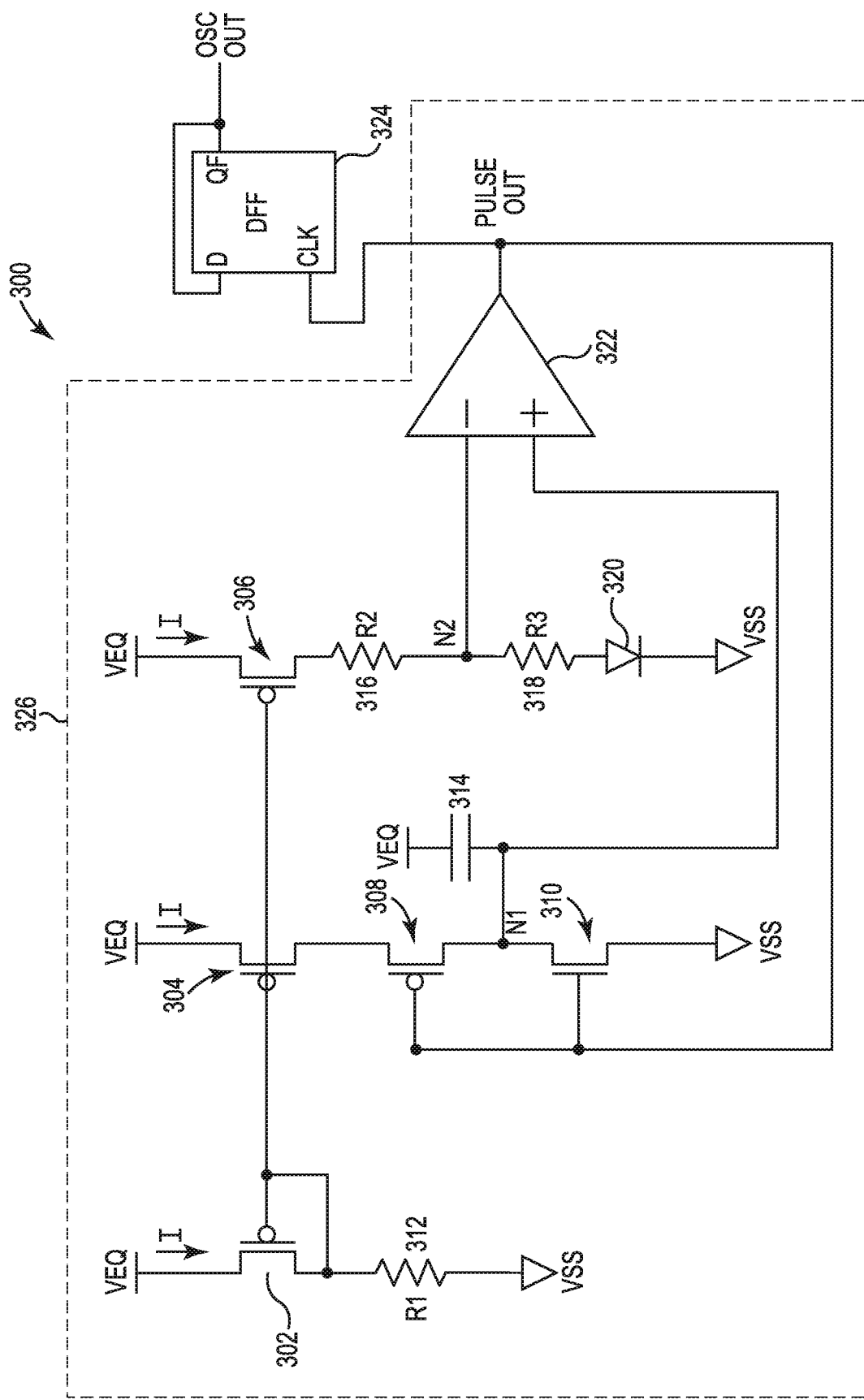
FIG. 3 is a schematic of an oscillator circuit in accordance with an embodiment of the present disclosure.

FIG. 3 is a schematic of an oscillator circuit 300 in accordance with an embodiment of the present disclosure. The oscillator circuit 300 may be an example of the oscillator circuit 102 of FIG. 1 and/or the oscillator circuit 200 of FIG. 2. The oscillator circuit 300 may provide an OSCILLATOR OUT signal having a period of tOsc. The oscillator circuit 300 may include a pulse generator circuit 326 and a flip-flop 324. The pulse generator circuit 326 may include transistors 302, 304, 306, 308, and 310, a capacitor 314, resistors 312, 316, and 318, a diode 320, and a comparator 322. In some embodiments, the transistors 302-308 may be p-channel transistors, while the transistor 310 may be an n-channel transistor. In other embodiments, the transistors 302-310 may be different types of transistors. The period of tOsc may at least be determined by the capacitance of the capacitor 314, resistor 316, a p-n junction voltage of the diode 320, and a current I.

The transistor 302 may be coupled to a reference voltage VEQ at a source, and further coupled by a drain to a reference voltage VSS via the resistor 312. In some embodiments. VSS may be a ground reference, and VEQ may be a supply voltage. For example, VEQ may be approximately 1.3-1.4 volts. The transistor 302 may be diode-coupled with the drain coupled to a gate. The gate of the transistor 302 may further be coupled to gates of the transistors 304 and 306. The transistor 304 may further be coupled to the reference voltage VEQ at a source and coupled at a drain to a source of the transistor 308. The transistor 306 may be coupled to the reference voltage VEQ at a source and further coupled at a drain to a node n2 through resistor 316. The combination of the transistor 302 and the resistor 312 may be configured as a current source providing the constant current I. Additionally, transistors 304 and 306 may form current mirrors with the transistor 302 through their respective gates being coupled. Accordingly, constant current I may be provided by transistors 304 and 306.

The transistor 308 may be coupled to the drain of the transistor 304 at a source and further coupled at a drain to a node n1. The transistor 310 may be coupled to the node n1 at a drain and coupled at a source to the reference voltage VSS. The capacitor 314 may be coupled between the node n1 and the reference voltage VEQ. The node n1 may further be coupled to a non-inverting input of the comparator 322. Gates of the transistors 308 and 310 may be coupled together and further be coupled to an output of the comparator 322. Depending on a voltage applied to the gates of the transistors 308 and 310, the constant current I may be flowing through the transistor 308 into the node n1, which, as a result, may flow into the capacitor 314. The capacitor 314 may be charged when the constant current I is flowing into the node n1. Additionally and also depending on the voltage applied to the gates of the transistors 308 and 310, current may flow from the node n1 to the voltage source VSS, which may result in the discharge of the capacitor 314. In some embodiments, it may be desirable to discharge the capacitor 314 at a relatively fast rate, which may be provided by configuring the transistor 310 to be relatively large.

The diode 320 may be coupled to the node n2 via resistor 318 and further coupled to the voltage source VSS. In some embodiments, the diode 320 may be a bipolar junction transistor (BJT). In some embodiments, the diode 320 may be an n-MOS p-n junction diode. The combination of the resistor 318 and the diode 320 may provide a reference voltage to the node n2.

The comparator 322 may have an inverting input and non-inverting input, with the non-inverting input coupled to the node n1 and the inverting input coupled to the node n2. An output of the comparator 322 may be coupled to the gates of the transistors 308 and 310, and further coupled to an input of the flip-flop 324. The comparator 322 may provide the PULSE OUT signal based on the respective voltages on the nodes n1 and n2. The PULSE OUT signal may have a period tPU based at least in part on the capacitor 314, the resistor 318, a junction voltage of the diode 320, and the constant current I.

The flip-flop 324 may have an inverted output coupled to a data input. The inverted output of the flip-flop 324 may also provide the OSCILLATOR OUT signal. A clock input of the flip-flop 324 may be coupled to the output of the comparator 322. The OSCILLATOR OUT signal may have a period tOsc, which may be based on the period tPU of the PULSE OUT signal. In some embodiments, the OSCILLATOR OUT signal, for example, may be provided to a refresh circuit, such as the refresh circuit 104 of FIG. 1.

The PULSE OUT signal may be based on the relative voltages on the nodes n1 and n2, Vn1 and Vn2, respectively. The PULSE OUT signal may alternatively enable and disable the transistors 308 and 310 due to their different transistor types. Further, the voltage Vn2 may be relatively constant, while the voltage Vn1 may be time-varying. The voltage Vn2 may be determined by the constant current I, the resistor 318, and the junction voltage of the diode 320. In an embodiment where the diode 320 is a BJT, the base-emitter junction voltage may be the diode 320 voltage. The voltage Vn1 may be time-varying due to the charging and discharging of the capacitor 314. The voltage Vn1 may, for example, have a saw tooth pattern. Further, the PULSE OUT signal may also be time-varying, and may form periodic pulses of period tPU. The pulses may occur when the voltages Vn1 and Vn2 equal.

In operation, the voltage level of the PULSE OUT signal may enable/disable the transistors 308 and 310, which may cause the capacitor 314 to charge and discharge. For example, when the voltage level of PULSE OUT is high, the transistor 308 may be disabled while the transistor 310 may be enabled. Accordingly, a current may begin to flow from the node n1 to the voltage source VSS, which may cause the capacitor 314 to discharge. In contrast, when the voltage level of PULSE OUT is low, the transistor 308 may be enabled while the transistor 310 may be disabled. Accordingly, the current I may flow into the node n1, which may charge the capacitor 314. As a result of alternatively enabling and disabling the transistors 308 and 310, the voltage Vn1 may be changing in response to the charging and discharging of the capacitor 314. Thus, the inverting input of the comparator 322 may receive a time varying input voltage based on a charging and discharging time of the capacitor 314.

As noted, the voltage Vn2 may be determined by the constant current I, the resistor 318, and a junction voltage of the diode 320. Because the inverting input of the comparator 322 may not pull any current from the node n2, the constant current I may flow through the resistor 316, the resistor 318, and the diode 320. Accordingly, the voltage Vn2 may be described by the equation I*R3+Vbe.

The period tPU of the PULSE OUT signal may be determined by an RC characteristic of the pulse generator circuit 326. The period tPU may be determined by the following equation:

$$tPU=(C*V)/I.\qquad\text{(Eq. 1)}$$

where C is the capacitance of the capacitor 314, V is the voltage at the node n2, and I is the constant current I. Replacing V with the voltage Vn2, shown above, may result in the following:

$$tPU=C*(R3+Vbe/I)\qquad\text{(Eq. 2)}$$

where C is the same as above, R3 is the resistance of the resistor 318, and Vbe is the junction voltage of the diode 320, assuming the diode 320 is formed from a BJT.

As discussed above, it is desirable that the period tPU not be affected by the temperature coefficient of the pulse generator circuit 326, e.g., the period does not change with respect to temperature. However, some of the components of the pulse generator circuit 326 may have non-zero temperature coefficients. For example, the resistor 318 may have a positive temperature coefficient, whereas both the junction voltage Vbe and the constant current I may have negative temperature coefficients. Accordingly, based on Equation 2, the resistance R3, and the current I may be configured so that the temperature coefficients of R3 and Vbe/I cancel each other out. As a result, the period tPU may not be affected by the non-zero temperature coefficients of the components of the pulse generator circuit 326. The Vbe may also affect the temperature coefficient of the period tPU, but a given Vbe may be assumed based on a selection of manufacturing materials and process that may affect and/or determine the junction voltage Vbe.

Figure 4:
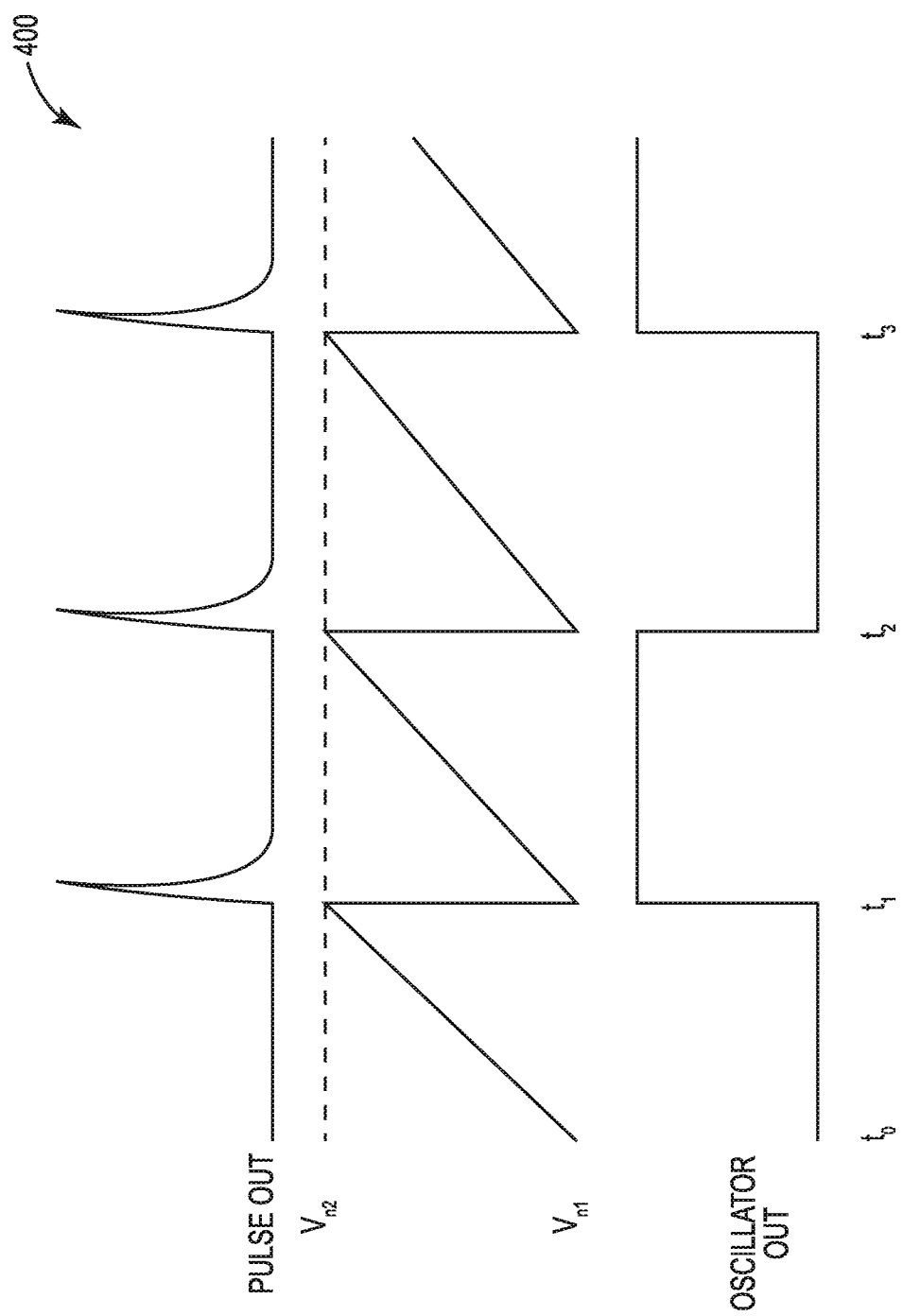
FIG. 4 is a timing diagram in accordance with an embodiment of the present disclosure.

FIG. 4 is a timing diagram 400 in accordance with an embodiment of the present disclosure. The timing diagram 400 may depict the voltages Vn1, Vn2, and the signals PULSE OUT, and OSCILLATOR OUT as they change with time. To facilitate discussion, FIG. 4 will be discussed with reference to FIG. 3. As discussed above, voltage Vn2 may be non time-varying, and may, in some embodiments, be a relatively high voltage. For example, voltage Vn2 may be around 0.8-1.0 volts.

From time t0 to t1, PULSE OUT may be at a low voltage, zero for example, which may enable the transistor 308 and disable the transistor 310. With the transistor 308 enabled and the transistor 310 disabled, the capacitor 314 may begin to charge due to current I. Charging the capacitor 314 may cause the voltage Vn1 to increase from zero. Because the capacitor 314, the voltage Vn1 may rise as a result. During the time from t0 to t1, the OSCILLATOR OUT signal may be at a low voltage.

At time t1, the voltage Vn1 may reach the voltage Vn2, which may cause comparator 322 to provide a high voltage for the PULSE OUT signal. While PULSE OUT is at a high voltage, the transistor 308 may be disabled and the transistor 310 may be enabled, which may cause the capacitor 314 to quickly discharge to the reference voltage VSS. Additionally, the change in the PULSE OUT signal to high may trigger the flip-flop 324 to change a voltage level of its output to high. Accordingly, from time t1 to t2, the OSCILLATOR OUT signal may remain at a high voltage level. However, the PULSE OUT signal may quickly fall back to the low voltage at time t1 due to the quick discharge of the capacitor 314. The PULSE OUT signal may be characterized as a pulse occurring when the voltages Vn1 and Vn2 equal.

From time t1 to t2, the sequence of voltage changes just discussed may reoccur resulting in the PULSE OUT signal providing a pulse at time t2. This pulse may cause the OSCILLATOR OUT signal to change to a low voltage. Accordingly, as time continues, the OSCILLATOR OUT signal may provide a periodic signal of period tOsc.

The period of tOsc may be based on the voltage Vn2 and a rate of voltage increase of voltage Vn1. The rate of increase of voltage Vn1 may be based on the capacitor 314 and the current I. For example, at a given current I, a large capacitance may be used to provide a longer period for tOsc because a large capacitance takes longer to charge the voltage Vn1 to the level of Vn2. In contrast, a smaller capacitance may be used to provide a shorter period for tOsc because it takes less time, in comparison to a large capacitance, to charge the smaller capacitance.

Figure 5:
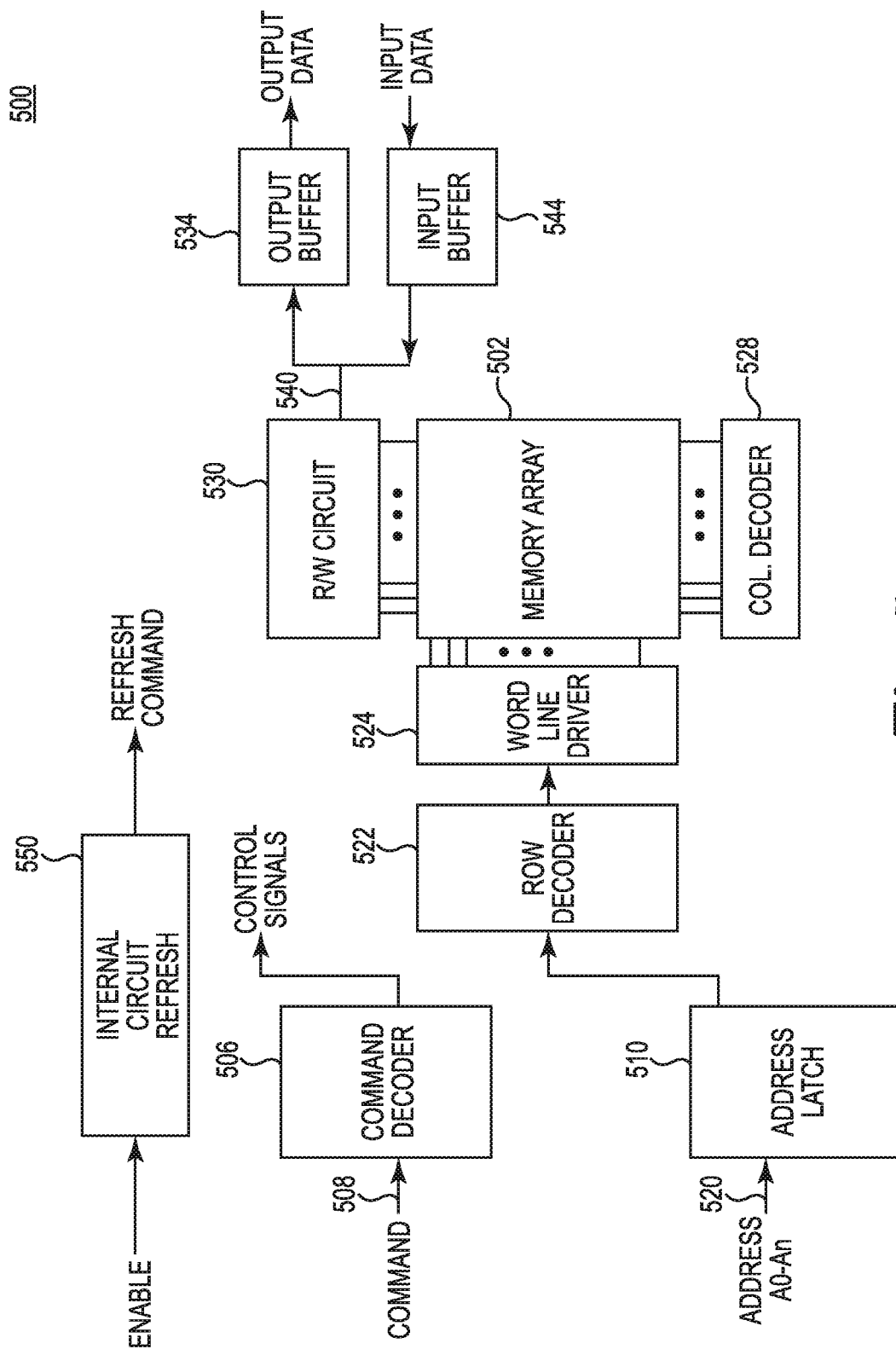
FIG. 5 illustrates a memory including a refresh timing circuit according to an embodiment of the present disclosure.

FIG. 5 illustrates a memory 500 including a refresh timing circuit according to an embodiment of the present disclosure. The memory 500 includes an array 502 of memory cells, which may be, for example, volatile memory cells (e.g., DRAM memory cells. SRAM memory cells), or some other types of memory cells. The memory system 500 includes a command decoder 506 that receives memory commands through a command bus 508 and generates corresponding control signals within the memory system 500 to carry out various memory operations. The command decoder 506 responds to memory commands applied to the command bus 508 to perform various operations on the memory array 502. For example, the command decoder 506 is used to generate internal control signals to read data from and write data to the memory array 502. Row and column address signals are applied to the memory system 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530.

A refresh timing circuit 550 may be included in the memory 500. The refresh timing circuit 550 may receive one or more control signals from the command decoder 508, and may provide refresh command to the row decoder 522 in response. In some embodiments, the control signal may be provided upon start up, which may enable the refresh timing circuit 500. Once enabled, the refresh timing circuit 550 may periodically provide the refresh commands to the row decoder 522. The timing of the refresh commands may be based on an internal oscillator of the refresh timing circuit 550. The internal oscillator of the refresh timing circuit 550 may be the oscillator circuit 300 of FIG. 3, for example. The internal oscillator may provide an oscillating signal of a period tOsc that has a temperature coefficient of zero.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus; comprising:
   a pulse generator circuit configured to provide a periodic pulse based on charging and discharging of a capacitor, the pulse generator circuit comprising:
   the capacitor coupled to a first node, wherein the capacitor is configured to be charged and discharged through the first node in response to the periodic pulse;
   a resistor and a diode coupled to a second node;
   a comparator coupled to the first and second nodes and configured to provide the periodic pulse based at least on the resistor and a current;
   a first transistor coupled to the first node; and
   a second transistor coupled to the first node and a third reference voltage, and wherein the first and second transistors are configured to be enabled and disabled in response to the periodic pulse.

2. The apparatus of claim 1, wherein a voltage of the first node is time-varying and a voltage of the second node is constant.

3. The apparatus of claim 1, further comprising:
   a flip-flop coupled to an output of the comparator.

4. The apparatus of claim 3, wherein the flip-flop is configured to provide an oscillating signal in response to the periodic pulse, and
   wherein a period of the oscillating signal is based on a period of the periodic pulse.

5. The apparatus of claim 1, wherein the pulse generator circuit is further configured to provide the periodic pulse based on first and second reference voltages, and
   wherein the resistor and the diode are coupled in series between the second node and the second reference voltage.

6. The apparatus of claim 1, wherein the pulse generator circuit further comprises another resistor coupled to the second node, and a third transistor coupled to the other resistor.

7. The apparatus of claim 1, wherein the pulse generator circuit further comprises a current source configured to provide the current, and
   wherein the second node has a voltage based on the current, the resistor and a junction voltage of the diode.

8. The apparatus of claim 1, wherein the resistor, the diode, and the current of the pulse generator circuit have respective temperature coefficients that cancel each other out.

9. An apparatus, comprising:
   a refresh timing circuit configured to provide refresh commands based on a number of periods of an oscillator signal; and
   an oscillator circuit comprising:
   a flip-flop configured to provide the oscillator signal; and
   a pulse generator circuit coupled to the flip-flop, the pulse generator circuit comprising:
   first and second transistors;
   a series-coupled resistor and diode; and
   a comparator having a first input coupled to the first and second transistors, a second input coupled to the series-coupled resistor and diode, and an output coupled to the flip-flop, wherein the first transistor is further coupled to a first node, and the first transistor includes a Gate coupled to an output of the comparator.

10. The apparatus of claim 9, wherein the oscillator circuit further comprises a second transistor coupled between the first node and a reference voltage, and the second transistor includes a gate coupled to the output of the comparator.

11. The apparatus of claim 10, wherein the pulse generator circuit is configured to provide a periodic pulse signal, and
    wherein the oscillator circuit further comprises a capacitor coupled between the first node and another reference voltage, and the capacitor is configured to be charged and discharged responsive to the periodic pulse signal.

12. The apparatus of claim 9, wherein the oscillator circuit further comprises a current source configured to provide a constant current, and wherein the
    second transistor is further coupled between the first node and a reference voltage.

13. The apparatus of claim 12, wherein the oscillator circuit further comprises a capacitor configured to be charged by the constant current when the first transistor is enabled and the second transistor is disabled, and
    wherein the capacitor is further configured to be discharged when the first transistor is disabled and the second transistor is enabled.

14. An apparatus, comprising:
    a refresh timing circuit configured to provide refresh commands based on a number of periods of an oscillator signal; and
    an oscillator circuit comprising:
    a pulse generator circuit configured to provide a periodic pulse signal, the pulse generator circuit comprising:
    a comparator having first and second inputs coupled to first and second nodes, respectively;
    first and second transistors coupled to the first input, wherein the first transistor comprises a gate coupled to an output of the comparator; and
    a series-coupled resistor and diode,
    wherein the series-coupled resistor and diode is coupled to the second node.

15. The apparatus of claim 14, wherein the oscillator circuit further comprises a flip-flop coupled to the output of the comparator, and the oscillator circuit is configured to provide the oscillator signal.

16. The apparatus of claim 14, wherein the pulse generator circuit further comprises a capacitor coupled to the first node.

17. The apparatus of claim 16, wherein the capacitor is configured to be charged when the first transistor is enabled and the second transistor is disabled, and
    wherein the capacitor is configured to be discharged when the first transistor is disabled and the second transistor is enabled.

* * * * *